(12) United States Patent
Yu et al.

(10) Patent No.: US 11,048,179 B2
(45) Date of Patent: Jun. 29, 2021

(54) APPARATUS FOR REMOVING RESIDUES FROM SOURCE VESSEL

(71) Applicant: SAMSUNG ELECTRONICS CO., LTD., Suwon-si (KR)

(72) Inventors: Ho Yu, Yongin-si (KR); Jinhwan Lee, Yongin-si (KR); Minseok Choi, Osan-si (KR); Jeonggil Kim, Hwaseong-si (KR); Jongbin Park, Gangneung-si (KR); Inho Choi, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/733,325

(22) Filed: Jan. 3, 2020

(65) Prior Publication Data

US 2020/0363736 A1 Nov. 19, 2020

(30) Foreign Application Priority Data

May 17, 2019 (KR) .......................... 10-2019-0058116

(51) Int. Cl.
*G03F 7/20* (2006.01)

(52) U.S. Cl.
CPC ................................ *G03F 7/70883* (2013.01)

(58) Field of Classification Search
CPC ............. G03F 7/70883; G03F 7/70033; G03F 7/70925; G03F 7/70975; H05G 2/005
See application file for complete search history.

(56) References Cited

U.S. PATENT DOCUMENTS

| 7,091,507 | B2 | 8/2006 | Masaki et al. | |
| 7,459,708 | B2 | 12/2008 | Inoue et al. | |
| 8,536,550 | B2* | 9/2013 | Asayama | B08B 13/00 250/504 R |
| 9,560,730 | B2 | 1/2017 | De Dea et al. | |
| 9,888,554 | B2 | 2/2018 | Baek et al. | |
| 10,362,664 | B2* | 7/2019 | Baek | G03F 7/70933 |
| 2002/0134947 | A1 | 9/2002 | Van Schaik | |
| 2005/0178979 | A1* | 8/2005 | Masaki | G03F 7/70925 250/492.1 |
| 2007/0069160 | A1* | 3/2007 | Banine | G03F 7/70925 250/504 R |
| 2010/0071720 | A1* | 3/2010 | Ehm | B08B 7/00 134/2 |
| 2010/0192973 | A1 | 8/2010 | Ueno et al. | |
| 2010/0288302 | A1* | 11/2010 | Ehm | B08B 5/02 134/1.1 |
| 2011/0043774 | A1* | 2/2011 | Hembacher | G03F 7/70925 355/30 |
| 2012/0119116 | A1* | 5/2012 | Kakizaki | G21K 5/00 250/504 R |
| 2012/0313016 | A1* | 12/2012 | Fleurov | H05G 2/008 250/504 R |

(Continued)

*Primary Examiner* — Deoram Persaud
(74) *Attorney, Agent, or Firm* — Lee IP Law, P.C.

(57) ABSTRACT

An apparatus for removing residues from a source vessel in an extreme ultraviolet lithography device, the apparatus including a frame portion, and a heater structure on the frame portion, the heater structure having a head on the frame portion, the head being rotatable in at least one shaft direction, and a heater on the head to dissipate heat toward residues in the source vessel, the heater to apply temperature of 200° C. to 800° C.

20 Claims, 14 Drawing Sheets

(56) References Cited

U.S. PATENT DOCUMENTS

| | | | |
|---|---|---|---|
| 2013/0319466 A1* | 12/2013 | Mizoguchi | G03F 7/70925 134/18 |
| 2014/0102881 A1* | 4/2014 | Ershov | G03F 7/70925 204/192.34 |
| 2014/0320834 A1* | 10/2014 | Mikami | G03F 7/2012 355/67 |
| 2015/0108365 A1* | 4/2015 | Niimi | H01J 7/24 250/429 |
| 2015/0241781 A1 | 8/2015 | Carcasi et al. | |
| 2015/0338753 A1* | 11/2015 | Riepen | G03F 7/70008 250/504 R |
| 2016/0207078 A1 | 7/2016 | Becker et al. | |
| 2019/0155179 A1* | 5/2019 | Wu | G03F 7/70175 |
| 2020/0041908 A1* | 2/2020 | Yen | G03F 7/70033 |
| 2020/0146136 A1* | 5/2020 | Yu | H05G 2/006 |

\* cited by examiner

APPARATUS FOR REMOVING RESIDUES FROM SOURCE VESSEL

CROSS-REFERENCE TO RELATED APPLICATION

Korean Patent Application No. 10-2019-0058116, filed on May 17, 2019, in the Korean Intellectual Property Office, and entitled: "Apparatus for Removing Residues from Source Vessel," is incorporated by reference herein in its entirety.

BACKGROUND

1. Field

Example embodiments relate to an apparatus for removing residues from a source vessel.

2. Description of the Related Art

Generally, when an extreme ultraviolet (EUV) lithography device is used for a certain period of time, residual tin, e.g., which has not been processed, may remain in an EUV source vessel. The residual tin may be adhered to and congealed on an internal surface of the EUV source vessel. Further, if a nozzle, from which tin flows, and a surrounding region of the nozzle are blocked, contamination of the internal space of the EUV source vessel may increase, such that an EUV source may not operate smoothly.

SUMMARY

According to an example embodiment, an apparatus for removing residues from a source vessel in an extreme ultraviolet lithography device may include a frame portion, and a heater structure on the frame portion, the heater structure having a head on the frame portion, the head being rotatable in at least one shaft direction, and a heater on the head to dissipate heat toward residues in the source vessel, the heater to apply temperature of 200° C. to 800° C.

According to an example embodiment, an apparatus for removing residues from a source vessel in an extreme ultraviolet lithography device may include a frame portion, the frame portion being moveable, and a heating structure on the frame portion, the heating structure being rotatable and foldable toward the frame portion.

According to an example embodiment, a source vessel of an extreme ultraviolet lithography device may include a first chamber to accommodate target material, an internal space below the first chamber, and an apparatus for removing residues from the source vessel in the internal space, the apparatus having a frame portion, and a heater structure on the frame portion, the heater structure having a head on the frame portion, the head being foldable toward the frame portion, and a heater on the head and facing a surface of the internal space, the heater to apply temperature of 200° C. to 800° C.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, embodiments will be described as follows with reference to the accompanying drawings.

Figure 1:
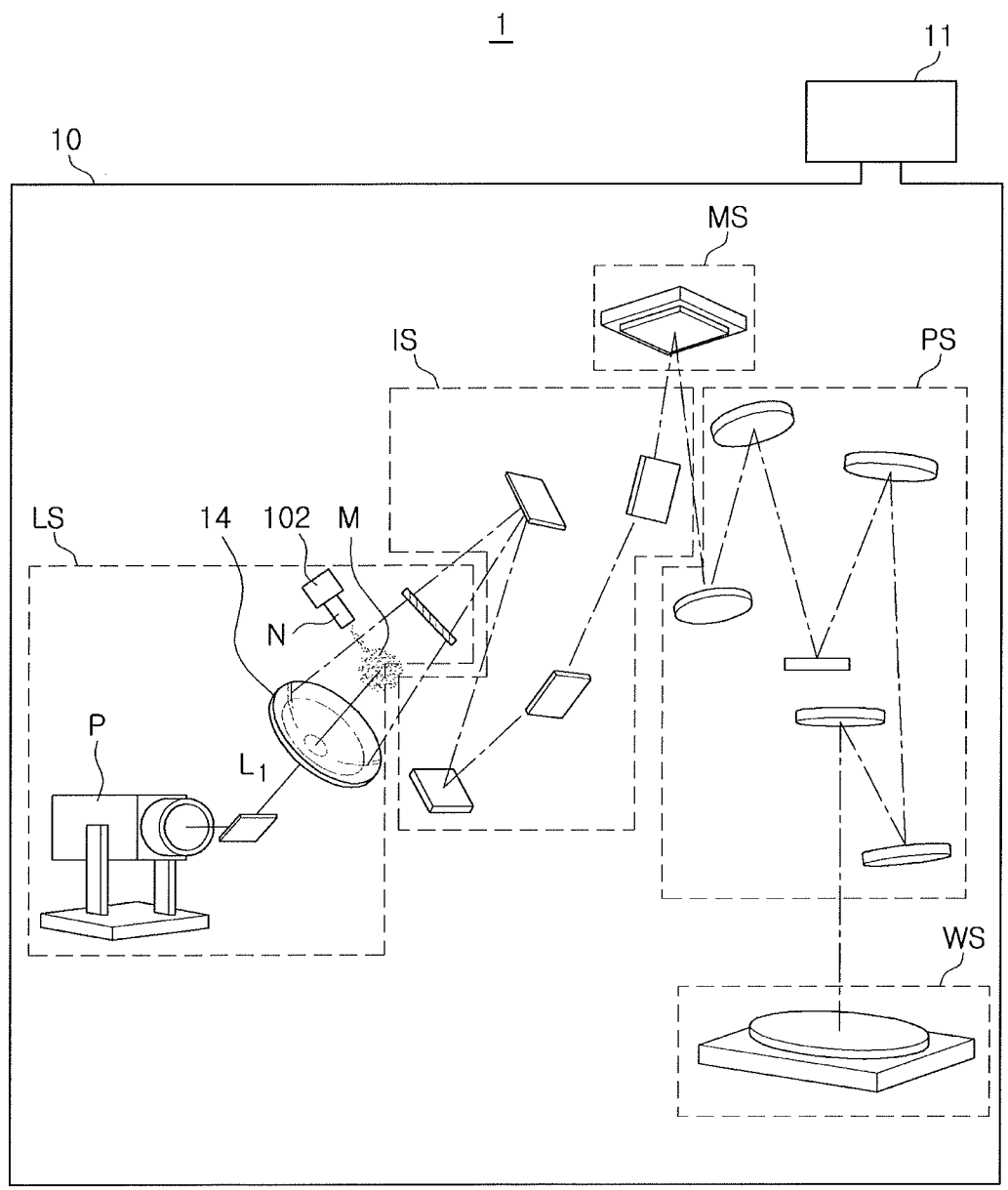
FIG. 1 illustrates a diagram of an extreme ultraviolet lithography device with a source vessel for use according to an example embodiment.

FIG. 1 is a diagram illustrating an extreme ultraviolet (EUV) lithography device to which an apparatus for removing residues from a source vessel is used according to an example embodiment.

Referring to FIG. 1, an EUV lithography device 1 may include a light source system LS generating exposure light, an optical system adjusting exposure light generated from the light source system LS, and a substrate system WS.

The optical system may include an illumination optical system IS transmitting exposure light generated from the light source system LS, a mask system MS patterning the exposure light transmitted from the illumination optical system IS, and a projection optical system PS transmitting the light patterned by the mask system MS to the substrate system WS.

The light source system LS, the illumination optical system IS, the mask system MS, the projection optical system PS, and the substrate system WS may be accommodated in a chamber 10 isolating the components from an external entity. The chamber 10 may be connected to a vacuum pump, and may be connected to a molecular oxygen supply device 11.

The light source system LS may include a light source P, a collector 14, and a source vessel 102. The light source system LS may generate EUV exposure light by collecting and reflecting a high temperature plasma beam produced by irradiating from the light source P laser light $L_1$ having a high strength pulse to a target material M sprayed from a source nozzle portion N of the source vessel 102. The source vessel 102 may dispose drops of the target material M, e.g., tin drops, such that pulses of the laser light $L_1$ hitting the target material M produce plasma that emits the EUV light. The source vessel 102 will be described in more detail below with reference to FIGS. 5-6.

Figure 2:
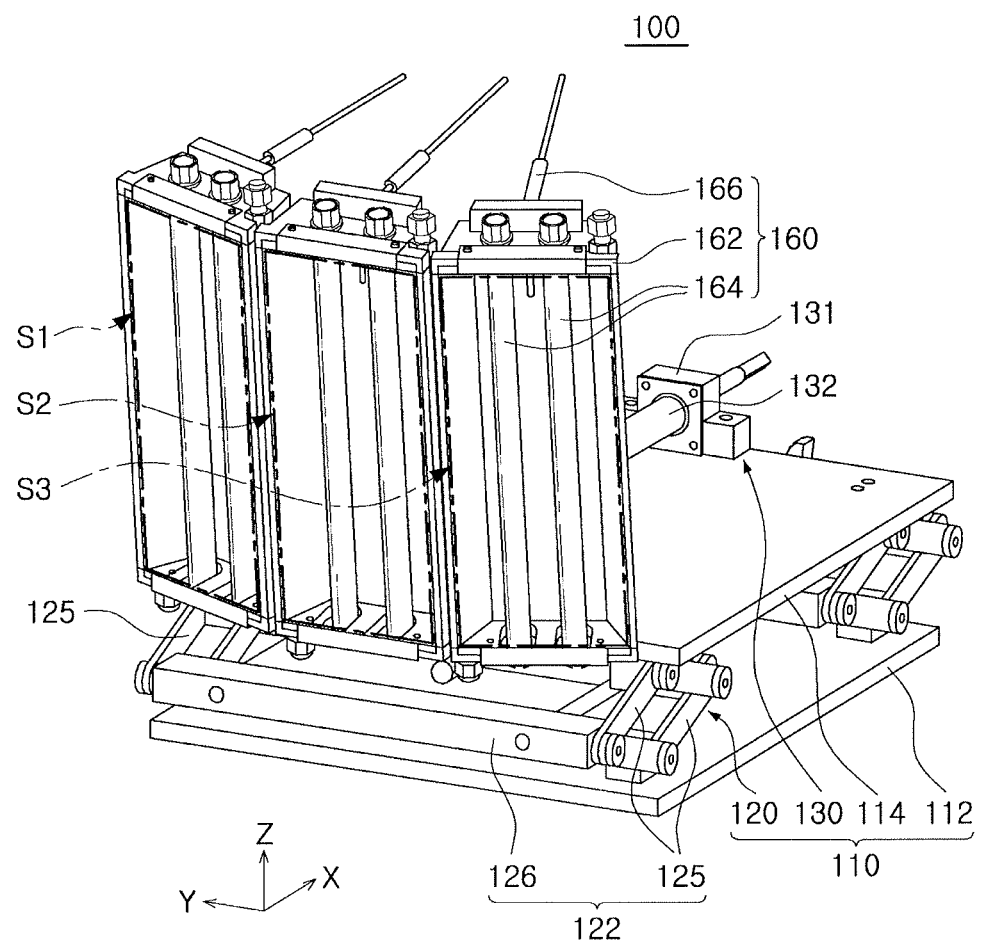
FIG. 2 illustrates a perspective diagram of an apparatus for removing residues from a source vessel according to an example embodiment.
Figure 3:
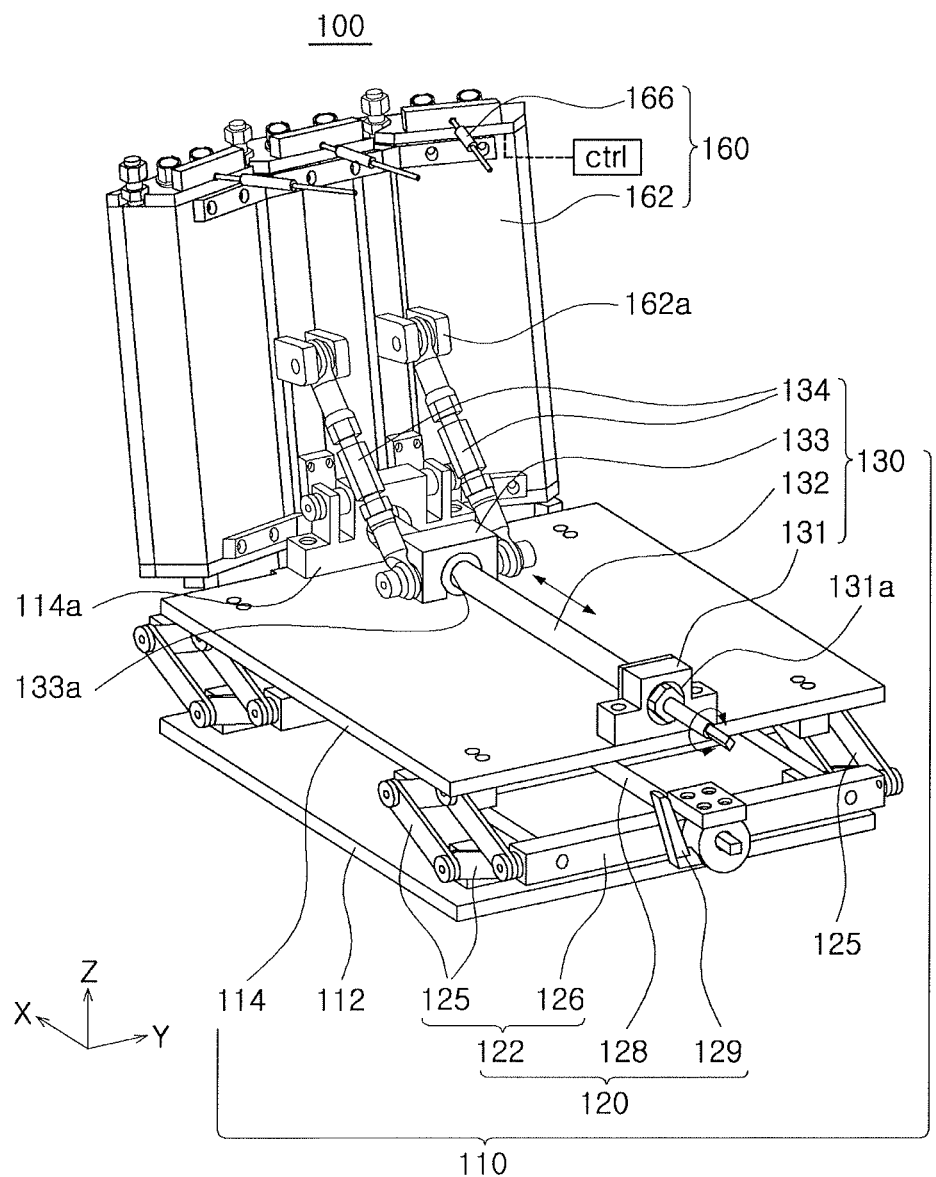
FIG. 3 illustrates a perspective diagram of the apparatus in FIG. 2 viewed from a different angle.
Figure 4:
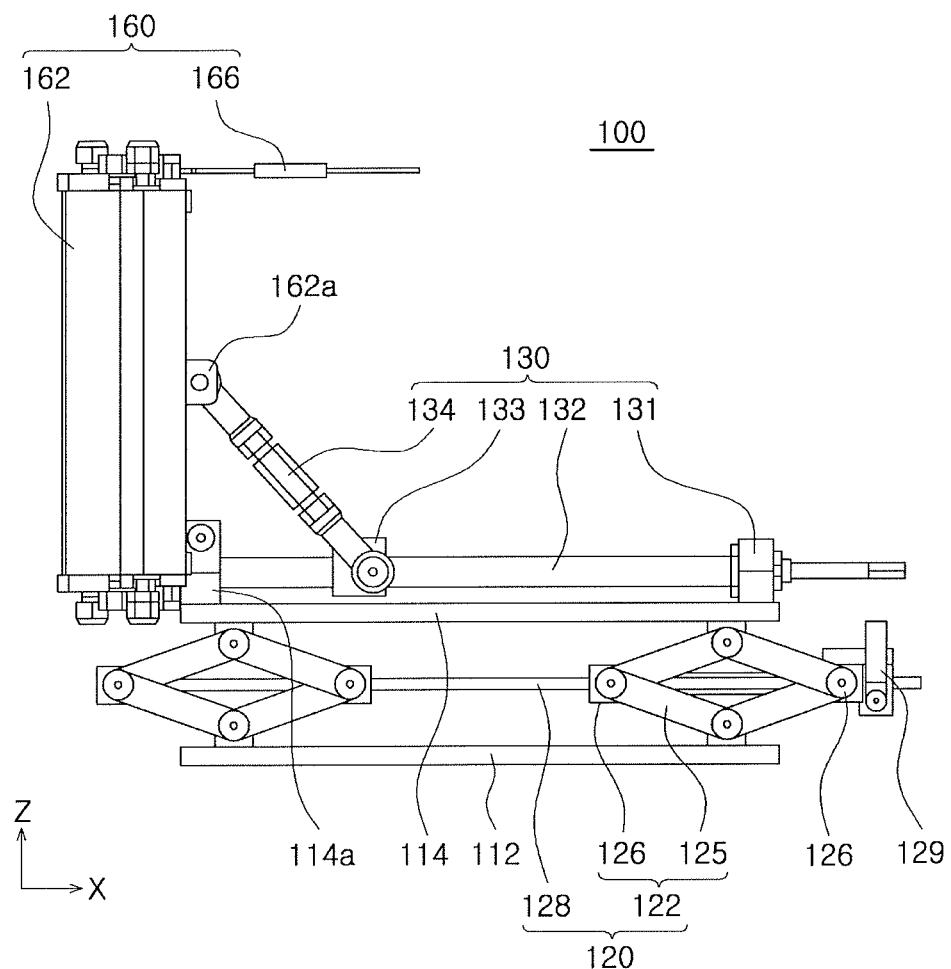
FIG. 4 illustrates a side elevation diagram of the apparatus in FIG. 2.

FIG. 2 is a partial perspective view of an apparatus for removing residues from the source vessel 102 according to an example embodiment. FIG. 3 is a perspective view of the apparatus in FIG. 2, as viewed from a different angle. FIG. 4 is a side elevation view of the apparatus in FIG. 2.

Referring to FIGS. 2 to 4, an apparatus 100, i.e., an apparatus for removing residues from the source vessel 102, may include a frame portion 110 and a heating unit 160 (i.e., a heater structure). The heating unit 160 may be installed in the frame portion 110.

In detail, the frame portion 110 may include a first plate 112, a second plate 114, an elevation driving unit 120 (i.e., an elevation driver), and a rotation driving unit 130 (i.e., a rotation driver).

For example, the first plate 112 may have a quadrangular, e.g., square, shape. For example, the first plate 112 may have a size of about 500 mm×700 mm as a maximum size, such that the first plate 112 could fit in, e.g., may be placed in and withdrawn from, the source vessel. As an example, the first plate 112 may have a size of about 500 mm×700 mm to about 100 mm×200 mm. As another example, the first plate 112 may have a size of about 400 mm×500 mm to about 200 mm×300 mm.

The second plate 114 may be spaced apart from the first plate 112, e.g., along the Z-axis. The second plate 114 may have a shape corresponding to that of the first plate 112, e.g., a square shape. The second plate 114 may also have a size corresponding to that of the first plate 112, e.g., the first and second plates 112 and 114 may have substantially same sizes. For example, as illustrated in I FIGS. 2-4, the first and second plates 112 and 114 may be positioned to overlap each other. An installation stand 114a, on which the heating unit 160 is installed, may be provided on an upper surface of the second plate 114, i.e., a surface of the second plate 114 facing way from the first plate 112. The heating unit 160 may be rotatably installed in the installation stand 114a, e.g., the heating unit 160 may rotate in the installation stand 114a to fold (e.g., to bend at the installation stand 114a) toward the second plate 114.

The elevation driving unit 120 may be disposed between the first plate 112 and the second plate 114. The elevation driving unit 120 may be configured to move up and down the second plate 114. The elevation driving unit 120 may adjust a spacing distance between the first plate 112 and the second plate 114, .g., along the Z-axis, within 0 mm to 500 mm in accordance with a size of the source vessel. To this end, the elevation driving unit 120 may include, e.g., a foldable member 122 and a first rotating shaft 128.

For example, as illustrated in FIG. 4, a first end of the foldable member 122 may be connected to the first plate 112 and a second end of the foldable member 122 (opposite the first end along the Z-axis) may be connected to the second plate 114, e.g., to adjust a distance between the first and second plates 112 and 114 along the Z-axis. For example, as illustrated in FIG. 2, two foldable members 122 may be installed between the first and second plates 112 and 114, e.g., the two foldable members 122 may be spaced apart from each other along the X-axis to be in a front end portion and a rear end portion of each of the first and second plates 112 and 114. In another example, only one foldable member 122 may be disposed in a central portion between the first and second plates 112 and 114.

The foldable member 122 may include a foldable link portion 125 and a connection portion 126. For example, as illustrated in FIG. 4, the foldable link portion 125 may include a total of four portions arranged into a quadrangle, e.g., a parallelogram, with two connection portions 126 at two opposite vertices of the quadrangle, e.g., each of the two connection portions 126 may extend along the Y-axis and be spaced apart from an adjacent connection portion 126 along the X-axis. For example, as further illustrated in FIG. 4, the foldable link portion 125 may include a first portion with a first end connected to the first plate 112 (e.g., at one vertex of the quadrangle not connected to the connection portion 126) and a second portion with a first end connected to the second plate 114 (e.g., at an opposite vertex of the quadrangle not connected to the connection portion 126). The first rotating shaft 128 may penetrate and be installed in the connection portion 126.

A pair of two foldable link portions 125 may be disposed on both side surfaces of each of the first and second plates 112 and 114, and the connection portion 126 may connect the foldable link portions 125. For example, as illustrated in FIG. 2, the pair of two foldable link portions 125 may be spaced apart from each other along the Y-axis to be at opposite edges of the frame portion 110, with the connection portion 126 connecting the pair of two foldable link portions 125, e.g., two connection portions 126 may connect each pair of foldable link portions 125 (FIG. 4).

Referring to FIG. 3, the connection portion 126 may include a through-hole, and the first rotating shaft 128 may penetrate the through-hole of the connection portion 126 to be connected to the connection portion 126. The through-hole in the connection portion 126 may include a screw portion to move the connection portion 126 when the first rotating shaft 128 rotates.

The first rotating shaft 128 may be connected to the foldable member 122, and the foldable member 122 may be folded by rotation of the first rotating shaft 128. For example, when a worker connects a tool to the first rotating shaft 128 and rotates the first rotating shaft 128, the connection portion 126 of the foldable member 122 may move along the first rotating shaft 128, e.g., along the X-axis. Accordingly, the foldable link portion 125 installed in the connection portion 126 may be folded such that the second plate 114 may move up and down, e.g., the connection portion 126 may move right/left along the X-axis in FIG. 4 to expand/contract the width of the foldable member 122 (quadrangle) along the X-axis to adjust the height of the foldable member 122 (quadrangle) along the Z-axis in order to move the second plate 114 down/up.

The first rotating shaft 128 may include a control member 129 for preventing and allowing rotation of the first rotating shaft 128. For example, as illustrated in FIGS. 3-4, the control member 129 may be external to the frame portion 110, e.g., connected to the first rotating shaft 128 at an outer surface of an outermost connection portion 126.

The rotation driving unit 130 may be installed in the second plate 114, may be connected to the heating unit 160, and may rotate the heating unit 160. The rotation driving unit 130 may include a fixed block 131, a second rotating shaft 132, a moving block 133, and a connecting bar 134.

As illustrated in FIG. 3, the fixed block 131 may be fixed to and installed at a rear end portion of the upper surface of the second plate 114, i.e., at an end of the second plate 114 that is opposite to an end supporting the heating unit 160. The fixed block 131 may include an installation hole 131a, and the second rotating shaft 132 may penetrate through the installation hole 131a.

A first end of the second rotating shaft 132 may penetrate the fixed block 131, and a second end (opposite the first end) of the second rotating shaft 132 may be inserted and installed in the installation stand 114a of the second plate 114 (FIG. 4). The second rotating shaft 132 may include a screw portion to move the moving block 133 by rotation, e.g., the second rotating shaft 132 may penetrate through the moving block 133 (FIG. 4).

The moving block 133 may be movably installed on the second rotating shaft 132. As an example, the moving block 133 may be configured to move along the second rotating shaft 132, e.g., along the X-axis. The moving block 133 may include a mounting hole 133a, and the second rotating shaft 132 may penetrate through the mounting hole 133a and may be installed therein. The mounting hole 133a may include a screw portion to move the moving block 133 when the second rotating shaft 132 rotates.

A first end of the connecting bar 134 may be rotatably installed in the moving block 133, and a second end (opposite the first end) of the connecting bar 134 may be rotatably installed in the heating unit 160. As an example, a plurality of the connecting bars 134 may be provided (FIG. 3). As the connecting bar 134 is connected to the moving block 133, when the moving block 133 moves along the second rotating shaft 132, the heating unit 160 may be rotated by the connecting bar 134. In other words, referring to FIG. 3, when the moving block 133 moves along the second rotating shaft 132 (along the illustrated arrow), a bottom end (the first end) of the connecting bar 134 is moved with the moving block 133 along the second rotating shaft 132, such that a top end (the second end) of the connecting bar 134 rotates the heating unit 160 around the installation stand 114a.

Figure 5:
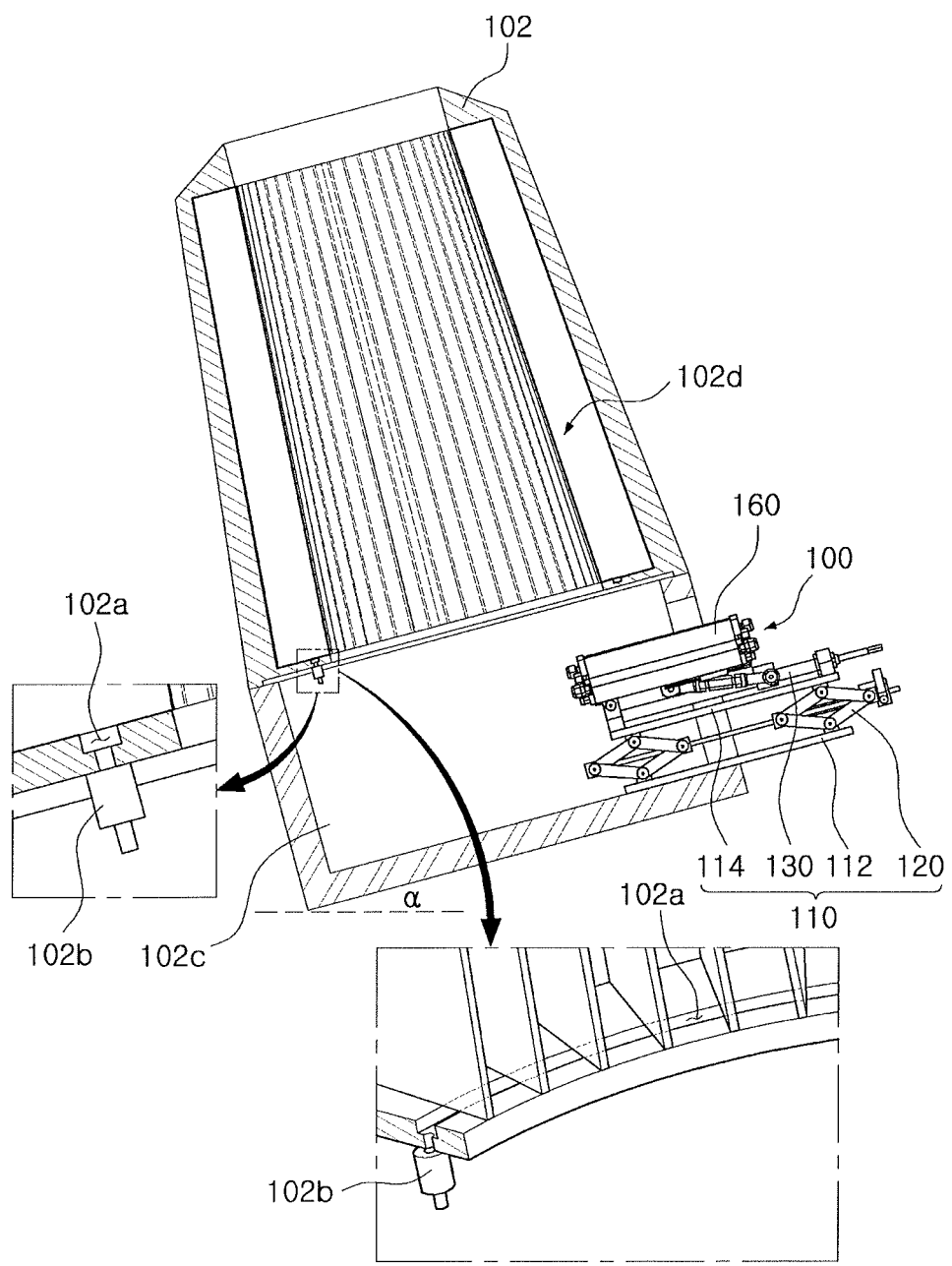
FIGS. 5 and 6 illustrate diagrams of operation of an apparatus for removing residues from a source vessel according to an example embodiment.

With respect to operation of the rotation driving unit 130, a worker may connect a tool to the second rotating shaft 132 and may rotate the second rotating shaft 132. Accordingly, the moving block 133 may move along the second rotating shaft 132. When the moving block 133 moves away from the fixed block 131, the heating unit 160 may rotate by the connecting bar 134 such that the heating unit 160 may be gradually stood up. When the moving block 133 moves close to the fixed block 131, the heating unit 160 may rotate by the connecting bar 134 such that the heating unit 160 may be gradually lowered, e.g., the heating unit 160 may be gradually bent toward the second plate (FIG. 5).

An on/off switch configured to be turned on or off in accordance with movement of the moving block 133 may be installed in the second plate 114. As the on/off switch is provided, power may be supplied to the heating unit 160 only when the heating unit 160 is stood up by a certain angle. Accordingly, a worker may be prevented from being exposed to a danger when power is supplied to the heating unit 160 while the heating unit 160 is lowered.

The heating unit 160 may be rotatably installed on the frame portion 110. As an example, the heating unit 160 may include at least one head 162 installed on the frame portion 110 and rotating in at least one shaft direction, and a heating member 164 (i.e., a heater) installed on the head 162 and dissipating heat toward residues in the source vessel.

A plurality of the heads 162 may be provided, and the plurality of heads 162 may be arranged to correspond to a shape of an internal surface of the source vessel, e.g., three heads 162 may be positioned to overlap a required internal surface of the source vessel (FIG. 2). A first end of the head 162 may be rotatably installed in the installation stand 114a of the second plate 114, e.g., so the first end of the head 162 in the installation stand 114a may rotate in accordance with movement of the connecting bar 134. For example, as illustrated in FIG. 3, when a plurality of heads 162 is provided, the heads 162 may be connected to each other, so only one of the heads 162 may be connected to the installation stand 114a. A connector 162a for connecting the connecting bar 134 may be provided in a central portion of a rear surface of the head 162, e.g., a connector 162a may be provided in a region between every two adjacent heads 162 (FIG. 3).

The head 162 may be configured to allow heat generated from the heating member 164 to be irradiated to a certain region. As an example, the head 162 may have a lamp shade shape. A coating layer for preventing oxidation may be formed on an internal surface of the head 162, e.g., the coating layer may be formed of a chromium material.

When the plurality of heads 162 is configured to oppose, e.g., face and overlap, an internal surface of the source vessel, a total size, e.g., a sum of areas facing the internal surface of the source vessel, of the heads 162 may be about 10000 mm$^2$ (200 m×50 m) to about 20000 mm$^2$ (500 mm×400 mm). Accordingly, an area in which residues (e.g., tin) are concentrated and congealed may have a width of about 300 mm and a height of about 100 mm to about 200 mm. The head 162 may have the above-described size of an area to focus light on a region in which residues are concentrated and congealed. For example, a sum (S1+S2+S3) of sizes of areas of the three heads 162 in FIG. 2 may be about 12500 mm$^2$ (250 m×50 m) to about 135000 mm$^2$ (450 mm×300 mm).

For example, as illustrated in FIG. 2, two heating members 164 may be installed in each of the heads 162. However, the number of installed heating members 164 may be varied in accordance with requirements. The heating member 164 may have a circular bar shape or any other convenient shape.

As an example, the heating member 164 may be implemented as a halogen lamp. In another example, the heating member 164 may also be implemented as a coil dissipating heat by an induced current.

A temperature of the heating member 164 may be configured to be within a range of about 200° C. to about 800° C. As a melting point of tin is 231.9° C. (i.e., a target source material used as a plasma source of an EUV beam), an appropriate temperature range of the heating member may be about 200° C. to about 300° C. However, to effectively remove tin and residues congealed on the source vessel, an effective temperature range of the heating member may be about 300° C. to about 500° C. The temperature range may be varied depending on a type of residue. In the example embodiment, the residue may be implemented as a tin residue. When the target source material is a material having a melting point lower or higher than that of tin, the above-described temperature range may be changed in accordance with a melting point of the target source material. Also, as described above, a size of the area (S1+S2+S3) of the heads 162 may be about 12500 mm$^2$ to about 135000 mm$^2$. Accordingly, a region in which residues (e.g., tin) are concentrated and congealed may have a width of about 300 mm and a height of about 100 mm to about 200 mm. Thus, to allow light to be focused on a region in which residues are concentrated and congealed, the head 162 may have the above-described area size. A temperature of heat applied from the heating member 164 to residues may be controlled to be within a range of about 230° C. to about 400° C. Accordingly, the congealed residues may be melted and removed.

The heating unit 160 may further include a temperature sensor 166 installed in the head 162. The temperature sensor 166 may sense a temperature of the heating member 164 and/or a temperature of the head 162. The temperature sensor 166 may be connected to a control portion (e.g., controller CTRL in FIG. 3), and the control portion may control the heating member 164 on the basis of the temperature sensed by the temperature sensor 166. Accordingly, the heating member 164 and/or the head 162 may be prevented from being overheated.

As described above, by melting residues remaining in the source vessel and removing the residues from the source vessel using the heating member 164, the time required for maintenance and repair work may be reduced.

Generally, a source vessel may be disassembled to perform maintenance and repair work. After performing the maintenance and repair work, the source vessel may be reassembled to remove residues remaining therein by setting an internal space of the source vessel at a vacuum state, followed by removing the residues remaining therein via a hot wire in the source vessel. Accordingly, a great amount of combined time may be required for the maintenance and repair work, which is followed by residues removal.

In contrast, according to example embodiment, residues remaining in the source vessel may be removed without reassembling the source vessel. In other words, the apparatus 100, i.e., the apparatus for removing residues from a source vessel, may be placed in the disassembled source vessel, and residues remaining in the source vessel may be removed using the apparatus. Accordingly, it may not be necessary to reassemble the source vessel or to set its internal space to a vacuum state. Thus, the time required for removing residues remaining in the source vessel may be reduced, e.g., as no time is required for reassembly and vacuum state.

Further, the removal of residues remaining in the source vessel may be performed while checking the removing work using a camera installed around the heating unit 160. Thus, it may be not necessary to perform the maintenance and repair work to remove residues again. Thus, the time required for removing residues remaining in the source vessel may be reduced further.

Figure 6:
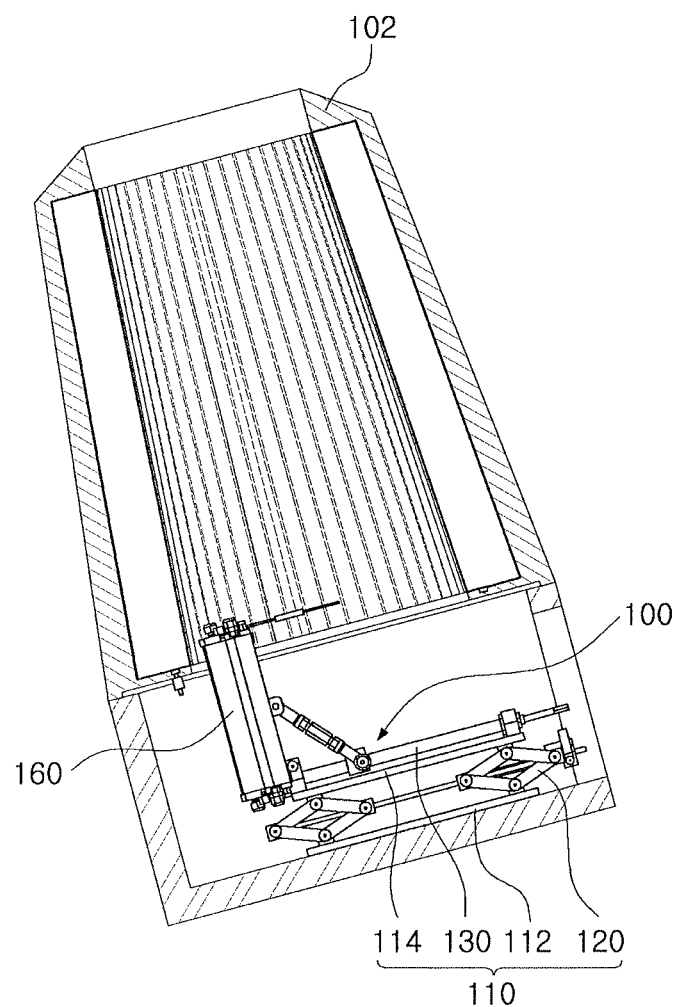

In the description below, example embodiments of operation of the apparatus 100, i.e., the apparatus for removing residues from a source vessel, will be described with reference to FIGS. 5-6. FIGS. 5 and 6 are diagrams illustrating operation of the apparatus 100 according to an example embodiment.

As illustrated in FIG. 5, when the source vessel 102 is disassembled, the apparatus 100 may be placed in an internal space 102c of the source vessel 102 through an opening formed in one region of the source vessel 102. The apparatus 100 may be placed in the internal space 102c of the source vessel 102 while the heating unit 160 of the apparatus 100 is lowered. For example, as illustrated in FIG. 5, when the heating unit 160 of the apparatus 100 is lowered, the heating unit 160 is folded at the installation stand 114a (FIG. 3) toward the frame portion 110, e.g., the head 162 may be bent toward the second plate 114 to extend substantially in parallel to and overlap the second plate 114 (FIGS. 3 and 5).

Referring to FIG. 6, when the apparatus 100 is placed in the internal space of the source vessel 102, the heating unit 160 may be lifted using the rotation driving unit 130, e.g., the head 162 of the heating unit 160 may rotate around the installation stand 114a (FIG. 3) to stand up (e.g., substantially perpendicularly to the second plate 114). The second plate 114 may move up using the elevation driving unit 120, and the heating member 164 of the heating unit 160 may irradiate light to a certain region of the source vessel 102.

When the above-described work is completed, i.e., when residues are removed, the heating unit 160 of the apparatus 100 may be lowered, e.g., the head 162 may be lowered back toward the second plate 114 (FIG. 5). The apparatus 100 may be removed from the internal space of the source vessel 102.

As illustrated in FIG. 5, the source vessel 102 may include a flow groove 102a in the internal space 102c thereof, while a chamber 102d for stirring target material M may be above the internal space 102c. Residue from the target material M may flow through the flow groove 102a. The source vessel 102 may be configured to be inclined by a certain angle a from a horizontal surface, as illustrated in FIG. 5. The flow groove 102a in which residues (e.g., tin) flow may be formed on the internal space of the source vessel 102. Accordingly, the residues in the source vessel 102 may be gathered in a certain region, and the discharge port 102b for discharging the residues to a lower portion may be provided in the certain region., e.g., residue may flow through the flow groove 102a toward the discharge port 102b due to the inclined angle. However, when the residues are congealed, the residues may not flow properly through the flow groove 102a or through the discharge port 102b, thereby contaminating components installed in the source vessel 102.

Accordingly, in the apparatus 100, light may be irradiated to only a certain region of the internal space of the source vessel 102, e.g., the heating unit 160 may be adjusted to face the certain region in which the residues are gathered, such that the residues may be removed from the certain region and/or from the blocked discharge port 102b. Accordingly, contamination of components in the source vessel 102 may be resolved.

FIGS. 5 and 6 illustrate a cross-sectional view of the source vessel 102, and the source vessel 102 may have a cylindrical shape having the internal space 102c. When the source vessel 102 is disassembled, it may be removed from the chamber 10 in FIG. 1.

Figure 7:
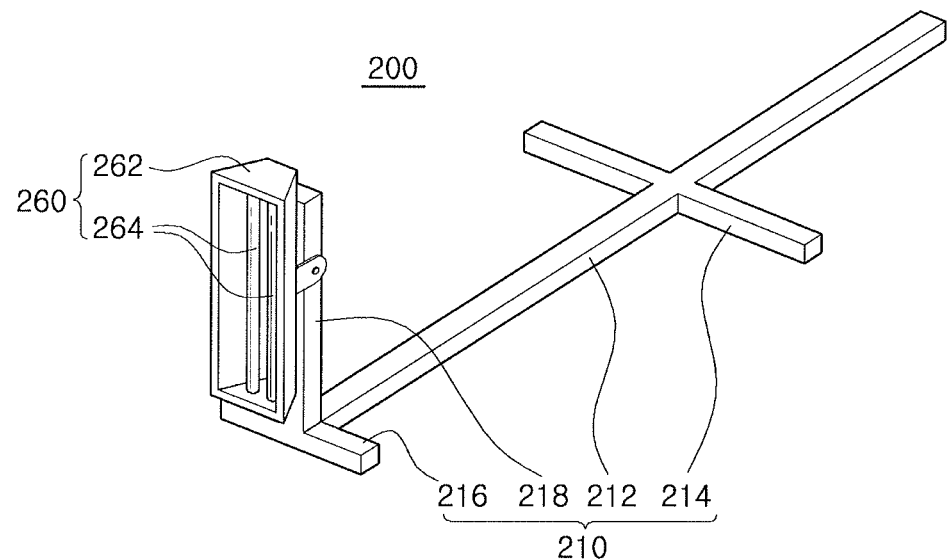
FIG. 7 illustrates a diagram of an apparatus for removing residues from a source vessel according to an example embodiment.

FIG. 7 is a diagram illustrating an apparatus for removing residues from the source vessel 102 according to an example embodiment.

Referring to FIG. 7, an apparatus 200, i.e., an apparatus for removing residues from a source vessel, may include a frame portion 210 and a heating unit 260. The heating unit 260 may be installed on the frame portion 210.

In detail, referring to FIG. 7, the frame portion 210 may include a main frame 212, a first support frame 214, a second support frame 216, and an installation frame 218. The heating unit 260 may be on the installation frame 218.

As illustrated in FIG. 7, the main frame 212 may have a bar shape of which a cross-sectional surface has a quadrangular, e.g., square, shape. When the apparatus 200 is placed in an internal space of the source vessel 102 (see FIGS. 5 and 6), an end of the main frame 212 opposite the heating unit 260 may be configured to be exposed from the source vessel 102, so the exposed end may be used to hold the apparatus 200 to dispose the heating unit 260 in an appropriate position.

The first support frame 214 may extend from around a central portion of the main frame 212. As an example, the first support frame 214 may extend from both side surfaces of the main frame 212, e.g., the first support frame 214 may have a linear shape intersecting the main frame 212. When the apparatus 200 is placed in the internal space of the source vessel 102, the first support frame 214 may support the internal surface of the source vessel 102.

The second support frame 216 may extend from one end portion of the main frame 212. As an example, the second support frame 216 may be configured to extend from both side surfaces of the main frame 212. Also, a length of the second support frame 216 may be less than a length of the first support frame 214. When the apparatus 200 is placed in the internal space of the source vessel, both end portions of the second support frame 216 may support a stepped portion formed on an internal surface of the source vessel 102.

The installation frame 218 may extend from an upper surface of one end portion of the main frame 212. The heating unit 260 may be rotatably installed on the installation frame 218. As an example, the installation frame 218 may have a bar shape of which a cross-sectional surface has a quadrangular, e.g., square, shape.

The heating unit 260 may be rotatably installed on the frame portion 210. As an example, the heating unit 260 may include a head 262 installed in the installation frame 218 and rotating in at least one shaft direction, e.g., the head 262 may extend along the installation frame 218 to be parallel thereto, and a heating member 264 installed in the head 262 and dissipating heat toward residues in the source vessel 102.

As an example, the head 262 may be coupled to the installation frame 218 by a hinge to rotate in upward and downward directions. The head 262 may be configured to allow heat generated form the heating member 264 to be irradiated to a certain region. As an example, the head 262 may have a lamp shade shape.

A coating layer for preventing oxidation may be formed on an internal surface of the head 262. As an example, the coating layer may be formed of a chromium material.

As an example, two heating members 264 may be installed in the head 262. However, an example embodiment thereof is not limited thereto, and the number of installed heating members 264 may be varied. The heating member 264 may have a bar shape of which a cross-sectional surface of the heating member 264 may have a circular shape. A shape of the heating member 264 may also be varied.

The heating member 264 may be implemented as a halogen lamp. However, an example embodiment is not limited thereto. The heating member 264 may also be implemented as a coil dissipating heat by an induced current.

Figure 8:
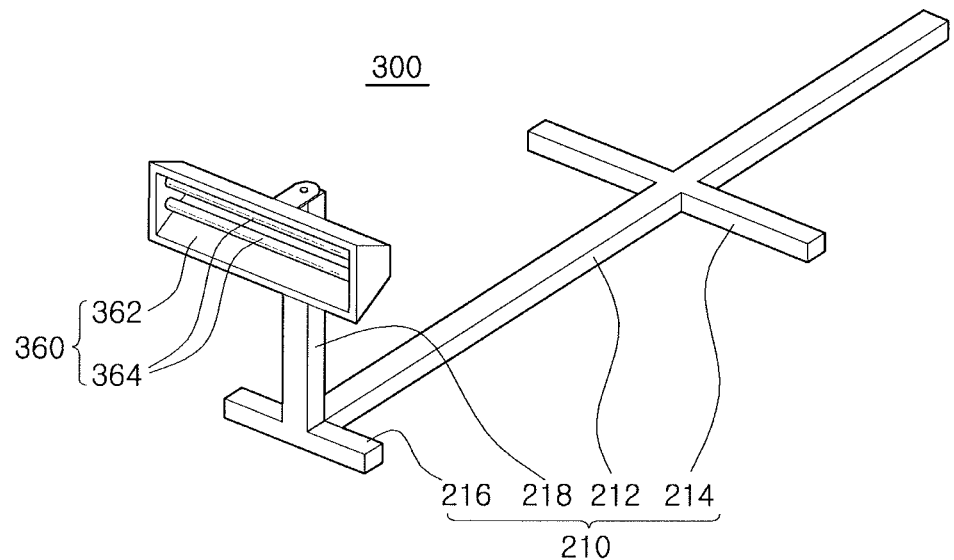
FIG. 8 illustrates a diagram of an apparatus for removing residues from a source vessel according to an example embodiment.

FIG. 8 is a diagram illustrating an apparatus for removing residues from a source vessel according to an example embodiment.

Referring to FIG. 8, an apparatus 300, i.e., an apparatus for removing residues from a source vessel, may include a frame portion 210 and a heating unit 360. The frame portion 210 may be the same as the frame portion 210 in FIG. 7.

The heating unit 360 may be rotatably installed on the frame portion 210. As an example, the heating unit 360 may include a head 362 installed in the installation frame 218 and rotating in at least one shaft direction, e.g., the head 362 may extend perpendicularly to the installation frame 218, and a heating member 364 dissipating heat towards residues in the source vessel 102 (see FIGS. 5 and 6).

As an example, the head 362 may be coupled to the installation frame 218 to rotate in right and left directions. The head 362 may be configured to allow heat generated from the heating member 364 to be irradiated to a certain region. As an example, the head 362 may have a lamp shade shape.

A coating layer for preventing oxidation may be formed on an internal surface of the head 362. As an example, the coating layer may be formed of a chromium material.

As an example, two heating members 364 may be installed in the head 362. However, an example embodiment thereof is not limited thereto, and the number of installed heating members 364 may be varied. The heating member 364 may have a bar shape of which a cross-sectional surface of the heating member 364 may have a circular shape. A shape of the heating member 364 may also be varied.

The heating member 364 may be implemented as a halogen lamp. However, an example embodiment is not limited thereto. The heating member 364 may also be implemented as a coil dissipating heat by an induced current.

Figure 9:
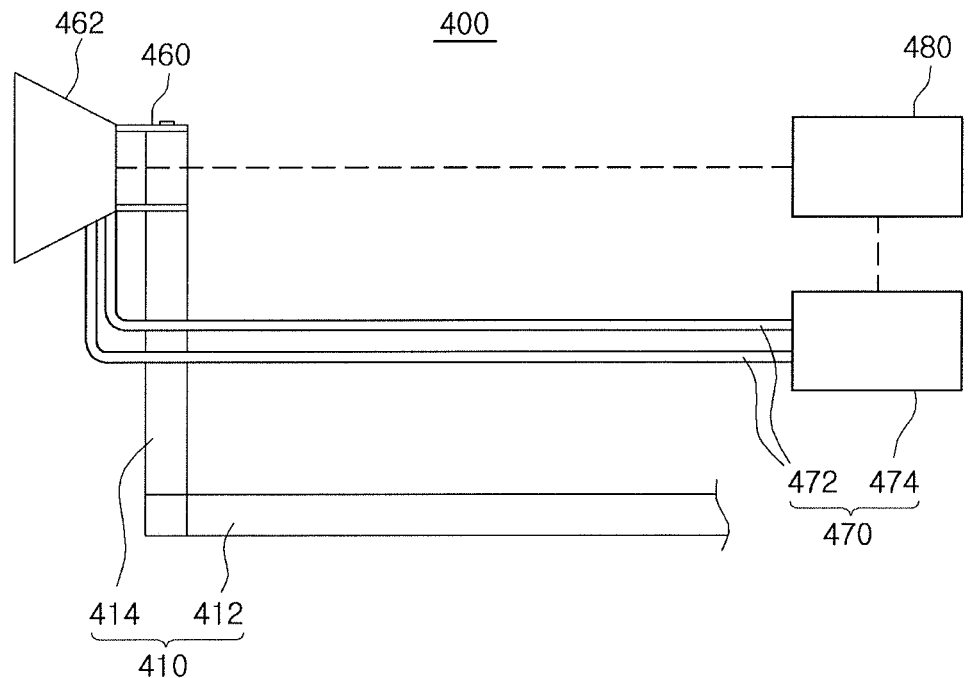
FIG. 9 illustrates a diagram of an apparatus for removing residues from a source vessel according to an example embodiment.
Figure 10:
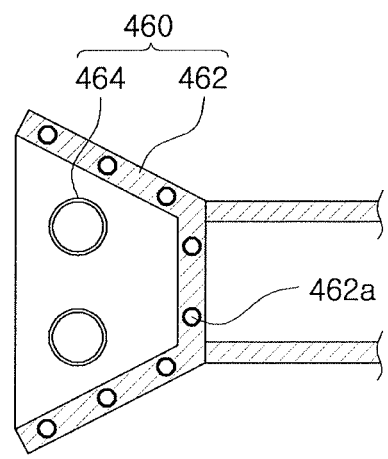
FIG. 10 illustrates a cross-sectional diagram of a head of an apparatus for removing residues from a source vessel according to an example embodiment.

FIG. 9 is a diagram illustrating an apparatus for removing residues from a source vessel according to an example embodiment. FIG. 10 is a cross-sectional diagram illustrating a head of the apparatus in FIG. 9.

Referring to FIGS. 9 and 10, an apparatus 400, i.e., an apparatus for removing residues from a source vessel, may include a frame portion 410, a heating unit 460, a cooling unit 470, and a control portion 480.

The frame portion 410 may include a main frame 412 and an installation frame 414. The main frame 412 may have a bar shape of which a cross-sectional surface has a quadrangular, e.g., square, shape. The installation frame 414 may extend from an upper surface of an end of the main frame 412.

The heating unit 460 may be installed in the installation frame 414. As an example, the heating unit 460 may include a head 462 installed in the installation frame 414 and rotating in at least one shaft direction, and a heating member 464 installed in the head 462 and dissipating heat towards residues in the source vessel 102 (see FIGS. 5 and 6).

The head 462 may be configured to allow heat generated from the heating member 464 to be irradiated to a certain region. As an example, the head 462 may have a lamp shade shape. A coating layer for preventing oxidation may be formed on an internal surface of the head 462. As an example, the coating layer may be formed of a chromium material.

The head 462 may include a cooling flow channel 462a, as illustrated in FIG. 10. The cooling flow channel 462a may be connected to the cooling unit 470.

Two heating members 464 may be installed in the head 462. However, an example embodiment thereof is not limited thereto. The number of installed heating members 464 may be varied. The heating members 464 may have a circular bar shape. A shape of the heating members 464 may also be varied.

For example, the heating members 464 may be implemented as a halogen lamp, but an example embodiment thereof is not limited thereto. The heating members 464 may be implemented as a coil dissipating heat by an induced current.

The cooling unit 470 may be connected to the head 462 and may prevent the head 462 from being overheated. As an example, the cooling unit 470 may include a cooling pipe 472 having one end connected to the cooling flow channel 462a of the head 462, and a cooling water supplying portion 474 connected to the other end of the cooling pipe 472. The cooling unit 470 may be connected to the control portion 480, and may supply cooling fluid, e.g., water. An amount of cooling fluid may be controlled by the control portion 480.

The control portion 480 may be connected to the cooling unit 470 and a temperature sensor installed in the head 462. As an example, the control portion 480 may control the cooling unit 470 in accordance with a signal from the temperature sensor and may prevent the heating unit 460 from being overheated.

Hereinafter, examples of heating units for an apparatus for removing residues from a source vessel will be described with references to FIGS. 11-22. FIGS. 11-17 illustrate a schematic view of surface of a heating unit facing a surface of the source vessel. FIGS. 18-21 illustrate a schematic side view of a heating unit facing a surface of the source vessel. The heating units may be installed on any of the frames described previously or hereinafter.

Figure 11:
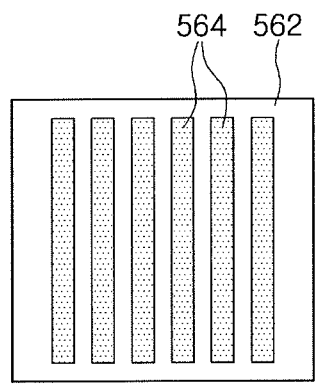
FIG. 11 illustrates a diagram of a heating member of an apparatus for removing residues from a source vessel according to an example embodiment.

FIG. 11 is a diagram illustrating a heating member of an apparatus for removing residues from the source vessel 102 according to an example embodiment.

Referring to FIG. 11, a heating unit of an apparatus for removing residues from a source vessel may include heating members 564 disposed in a head 562. The heating members 564 may form a plurality of columns. As an example, each heating member 564 may have a bar shape of which a cross-sectional surface has a circular shape.

Figure 12:
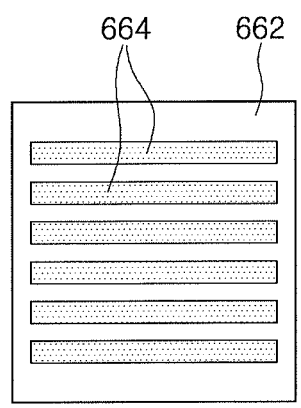
FIG. 12 illustrates a diagram of a heating member of an apparatus for removing residues from a source vessel according to an example embodiment.

FIG. 12 is a diagram illustrating a heating member of an apparatus for removing residues from a source vessel according to an example embodiment.

Referring to FIG. 12, a heating unit of an apparatus for removing residues from a source vessel may include heating members 664 disposed in a head 662. The heating members 664 may form a plurality of rows. As an example, each heating member 664 may have a bar shape of which a cross-sectional surface has a circular shape.

Figure 13:
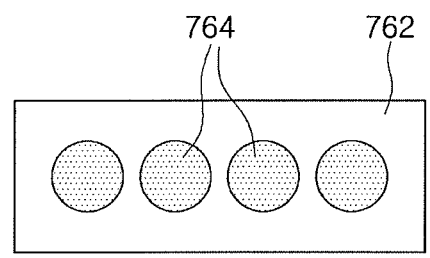
FIG. 13 illustrates a diagram of a heating member of an apparatus for removing residues from a source vessel according to an example embodiment.

FIG. 13 is a diagram illustrating a heating member of an apparatus for removing residues from a source vessel according to an example embodiment.

Referring to FIG. 13, a heating unit of an apparatus for removing residues from a source vessel may include heating members 764 disposed in a head 762. The heating member 764 may have a circular shape. The heating members 764 may form a plurality of columns, for example.

Figure 14:
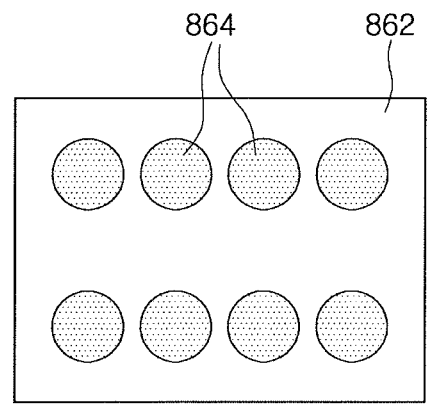
FIG. 14 illustrates a diagram of a heating member of an apparatus for removing residues from a source vessel according to an example embodiment.

FIG. 14 is a diagram illustrating a heating member of an apparatus for removing residues from a source vessel according to an example embodiment.

Referring to FIG. 14, a heating unit of an apparatus for removing residues from a source vessel may include heating members 864 disposed in a head 862. The heating member 864 may have a circular shape. The heating members 864 may form a plurality of columns and rows, for example.

Figure 15:
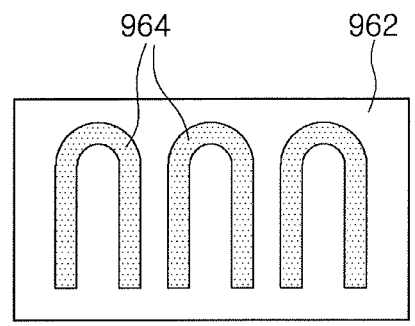
FIG. 15 illustrates a diagram of a heating member of an apparatus for removing residues from a source vessel according to an example embodiment.

FIG. 15 is a diagram illustrating a heating member of an apparatus for removing residues from a source vessel according to an example embodiment.

Referring to FIG. 15, a heating unit of an apparatus for removing residues from a source vessel may include heating members 964 disposed in a head 962. The heating member 964 may have an oval half-ring shape. The heating members 964 may form a plurality of columns, for example.

Figure 16:
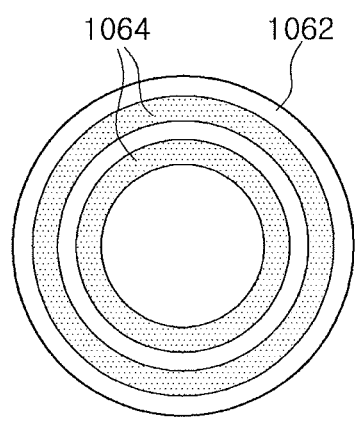
FIG. 16 illustrates a diagram of a heating member of an apparatus for removing residues from a source vessel according to an example embodiment.

FIG. 16 is a diagram illustrating a heating member of an apparatus for removing residues from a source vessel according to an example embodiment.

Referring to FIG. 16, a heating unit of an apparatus for removing residues from a source vessel may include heating members 1064 disposed in a head 1062. The heating member 1064 may have a circular ring shape. A plurality of heating members 1064 having different diameters may be provided, for example.

Figure 17:
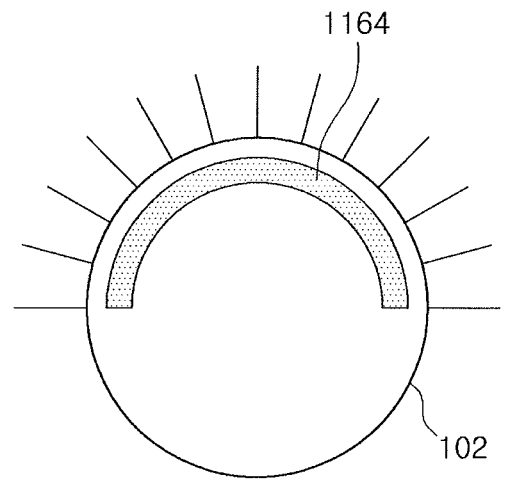
FIG. 17 illustrates a diagram of a heating member of an apparatus for removing residues from a source vessel according to an example embodiment.

FIG. 17 is a diagram illustrating a heating member of an apparatus for removing residues from a source vessel according to an example embodiment.

Referring to FIG. 17, a heating unit of an apparatus for removing residues from a source vessel may include a heating member 1164 having a circular half-ring shape. As an example, the heating member 1164 may have a shape corresponding to an internal surface of the source vessel 102.

Figure 18:
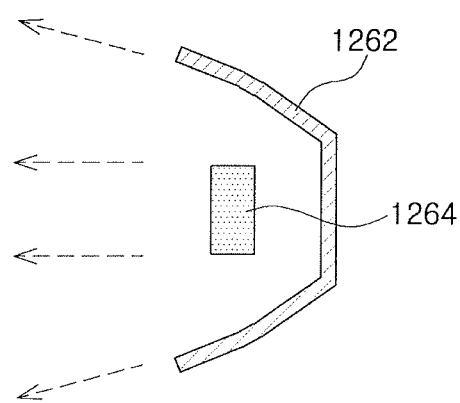
FIG. 18 illustrates a diagram of a head of an apparatus for removing residues from a source vessel according to an example embodiment.

FIG. 18 is a head of an apparatus for removing residues from a source vessel according to an example embodiment.

Referring to FIG. 18, a heating unit of an apparatus for removing residues from a source vessel may include a heating member 1264 disposed in a head 1262. Ends of the head 1262 may be configured to be inclined such that head dissipated from the heating member 1264 may be irradiated to a relatively wide region.

Figure 19:
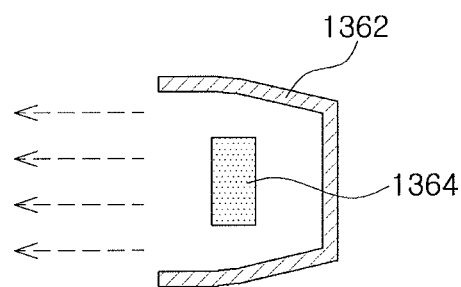
FIG. 19 illustrates a diagram of a head of an apparatus for removing residues from a source vessel according to an example embodiment.

FIG. 19 is a head of an apparatus for removing residues from a source vessel according to an example embodiment.

Referring to FIG. 19, a heating unit of an apparatus for removing residues from a source vessel may include a heating member 1364 installed in a head 1362. Ends of the heads 1362 may be configured to be parallel to each other to allow heat dissipated from the heating member 1364 to be concentrated on and irradiated to a certain region.

Figure 20:
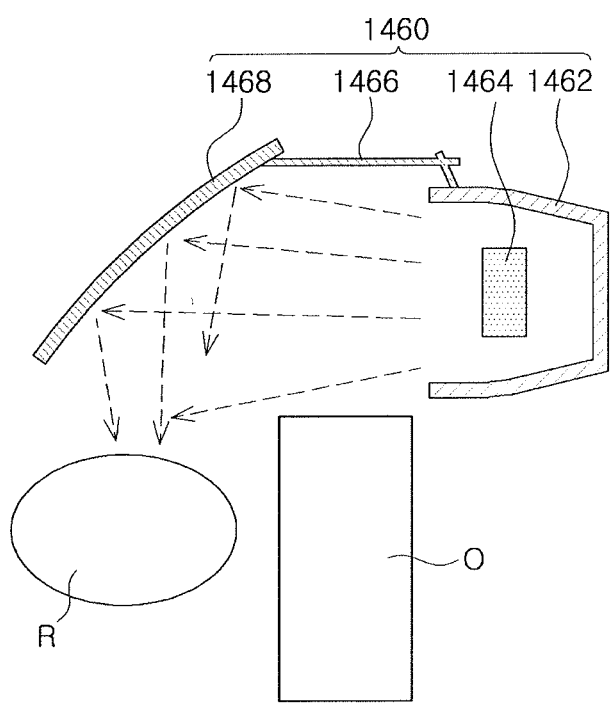
FIG. 20 illustrates a diagram of a heating unit of a source vessel according to an example embodiment.

FIG. 20 is a diagram illustrating a heating unit of a source vessel according to an example embodiment.

Referring to FIG. 20, a heating unit of an apparatus for removing residues from a source vessel may include a heating unit 1460 having a head 1462, a heating member 1464, a jig 1466, and a reflector 1468.

The head 1462 may be configured to allow head generated from the heating member 1464 to be irradiated to a certain region. As an example, the head 1462 may have a lamp shade shape. The heating member 1464 may be disposed in the head 1462. The heating member 1464 may be implemented as a halogen lamp, for example. One end of the jig 1466 may be installed on an upper surface of the head 1462. The reflector 1468 may be installed on the other end of the jig 1466. The reflector 1468 may be configured to change a route of light such that light irradiated from the heating member 1464 may be irradiated to residues R. Accordingly, by including the reflector 1468, even when there is an obstacle O, light irradiated from the heating member 1464 may be directly irradiated to the residues R.

Figure 21:
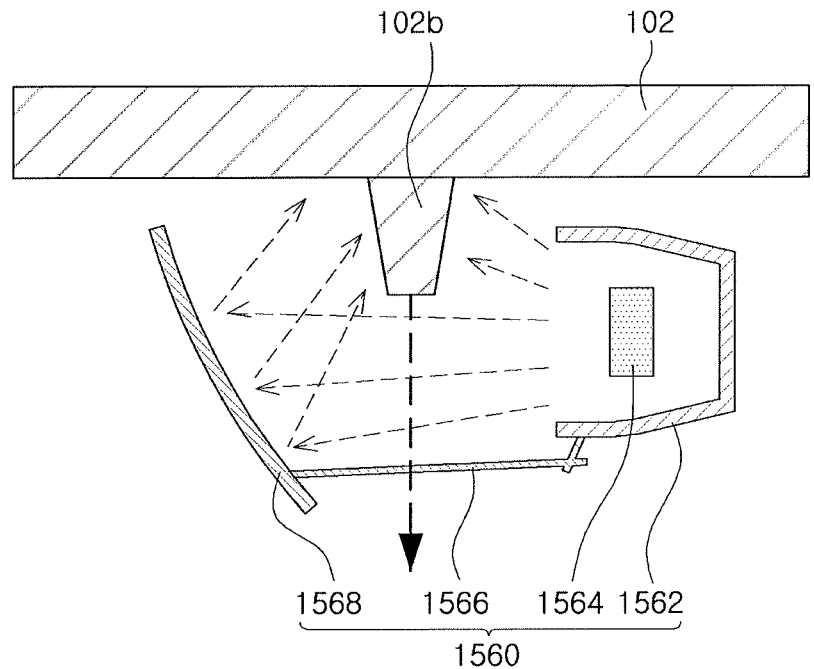
FIG. 21 illustrates a diagram of a heating unit of a source vessel according to an example embodiment.

FIG. 21 is a diagram illustrating a heating unit of a source vessel according to an example embodiment.

Referring to FIG. 21, a heating unit of an apparatus for removing residues from a source vessel may include a heating unit 1560 having a head 1562, a heating member 1564, a jig 1566, and a reflector 1568.

The head 1562 may be configured to allow heat generated from the heating member 1564 to be irradiated to a certain region. As an example, the head 1562 may have a lamp shade shape. The heating member 1564 may be disposed in the head 1562. The heating member 1564 may be implemented as a halogen lamp, for example. One end of the jig 1566 may be installed on a lower surface of the head 1562. The reflector 1568 may be installed on the other end of the jig 1566. The reflector 1568 may be configured to change a route of light such that light irradiated from the heating member 1564 may be irradiated to the other side of the discharge port 102b of the source vessel 102. Accordingly, by including the reflector 1568, light irradiated from the heating member 1564 may be irradiated to a relatively wide region.

Figure 22:
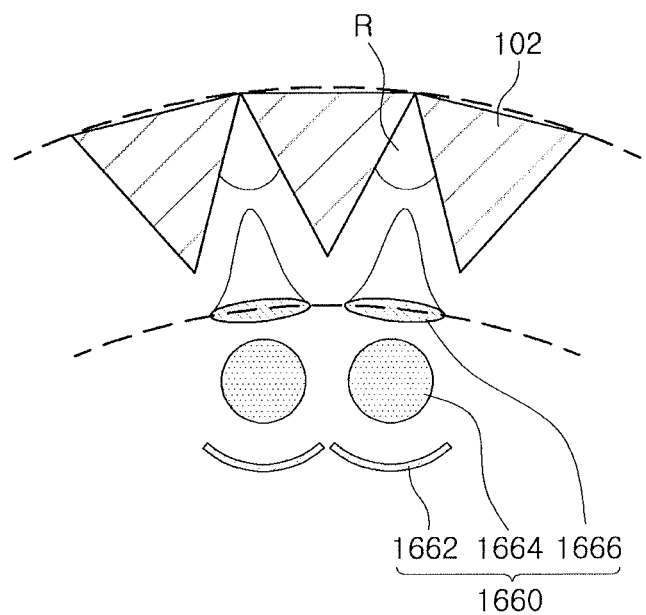
FIG. 22 illustrates a diagram of a heating unit of a source vessel according to an example embodiment.

FIG. 22 is a diagram illustrating a heating unit of a source vessel according to an example embodiment.

Referring to FIG. 22, a heating unit of an apparatus for removing residues from a source vessel may include a heating unit 1660 having a head 1662, a heating member 1664, and an optical lens 1666.

The head 1662 may be configured to allow heat generated from the heating member 1664 to be irradiated to a certain region. As an example, the head 1662 may have a lamp shade shape. The heating member 1664 may be disposed in the head 1662. The heating member 1664 may be implemented as a halogen lamp, for example.

The optical lens 1666 may be disposed in a front region of the heating member 1664, and may be configured to concentrate or to distribute light irradiated from the heating member 1664. As an example, the optical lens 1666 may concentrate light irradiated from the heating member 1664 and may control the light to be focused on residues R adhered to the source vessel 102.

By way of summation and review, it may be required to remove residual tin that is adhered and congealed on surfaces of an EUV source vessel, e.g., during maintenance and repair of the EUV source vessel. However, an excessive amount of time may be required for such maintenance and repair work.

Therefore, example embodiments provide an apparatus for removing residues from the EUV source vessel, while minimizing the overall required time for maintenance and repair work. That is, example embodiments provide a heating device for an EUV source vessel, which may be placed in an internal space of the EUV source vessel and may melt residual tin when the EUV source vessel is disassembled. The heating device may include a heating unit with a heat dissipating member implemented as a halogen lamp that may melt the residue tin during maintenance and repair work on the EUV source vessel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for removing residues from a source vessel in an extreme ultraviolet lithography device, the apparatus comprising:
   a frame portion; and
   a heater structure on the frame portion, the heater structure including:
      a head on the frame portion, the head being rotatable in at least one shaft direction, and
      a heater on the head to dissipate heat toward residues in the source vessel, the heater to apply temperature of 200° C. to 800° C.

2. The apparatus as claimed in claim 1, wherein a size of a surface of the head facing an internal surface of the source vessel is 12500 mm$^2$ to 135000 mm$^2$.

3. The apparatus as claimed in claim 1, wherein the frame portion includes:
   a first plate;
   a second plate spaced apart from the first plate;
   an elevation driver between the first plate and the second plate; and
   a rotation driver on the second plate and connected to the heater structure, the rotation driver to rotate the heater structure.

4. The apparatus as claimed in claim 3, wherein the elevation driver includes:
   a foldable member having a first end connected to the first plate and a second end connected to the second plate; and
   a first rotating shaft connected to the foldable member to fold the foldable member by rotation.

5. The apparatus as claimed in claim 4, wherein the foldable member includes:
   a foldable link portion having a first end connected to the first plate and a second end connected to the second plate, and
   a connection portion connecting the foldable link portions and moving along the first rotating shaft.

6. The apparatus as claimed in claim 3, wherein the rotation driver includes:
   a fixed block on the second plate;
   a second rotating shaft rotatable on the fixed block;
   a moving block moveable on the second rotating shaft; and
   a connecting bar connecting the moving block to the head.

7. The apparatus as claimed in claim 1, wherein the head is a plurality of heads, the plurality of heads being arranged to correspond to a shape of an internal surface of the source vessel.

8. The apparatus as claimed in claim 1, wherein the heater structure further includes a temperature sensor on the head.

9. The apparatus as claimed in claim 8, further comprising a controller connected to the temperature sensor and to the heater.

10. The apparatus as claimed in claim 9, wherein further comprising a flow channel in the head, a cooling pipe being connected to the flow channel.

11. The apparatus as claimed in claim 1, wherein the heater is a halogen lamp.

12. The apparatus as claimed in claim 11, wherein the heater has one of a circular bar shape, a circular shape, a circular ring shape, an oval half-ring shape, and a circular half-ring shape.

13. The apparatus as claimed in claim 11, wherein the head has a lamp shade shape.

14. The apparatus as claimed in claim 13, wherein the heater is in an internal space of the head, the heater being a plurality of heaters.

15. The apparatus as claimed in claim 1, wherein the heater structure further includes a reflector connected to the head to change a route of heat transmitted from the heater.

16. The apparatus as claimed in claim 15, wherein the heater structure further includes a jig connecting the reflector to the head.

17. The apparatus as claimed in claim 1, wherein the heating structure further includes an optical lens between the heater and a surface of the source vessel.

18. An apparatus for removing residues from a source vessel in an extreme ultraviolet lithography device, the apparatus comprising:
a frame portion, the frame portion being moveable; and
a heating structure on the frame portion, the heating structure being rotatable and foldable toward the frame portion.

19. A source vessel of an extreme ultraviolet lithography device, the source vessel comprising:
a first chamber to accommodate target material;
an internal space below the first chamber; and
an apparatus for removing residues from the source vessel in the internal space, the apparatus including:
a frame portion, and
a heater structure on the frame portion, the heater structure having:
a head on the frame portion, the head being foldable toward the frame portion, and
a heater on the head and facing a surface of the internal space, the heater to apply temperature of 200° C. to 800° C.

20. An extreme ultraviolet lithography device including the source vessel as claimed in claim 19, further comprising:
a second chamber;
a light source system to generate exposure light, the light source system including:
the source vessel,
a source nozzle portion connected to the source vessel, the source nozzle portion to supply the target material to produce plasma, and
a collector to collect and reflect the produced plasma, the collector being spaced apart from the source vessel; and
an optical system to adjust and pattern the exposure light generated from the light source system, the optical system including:
an illumination optical system to transmit the exposure light generated from the light source system,
a mask system to pattern the exposure light transmitted from the illumination optical system, and
a projection optical system to transmit the light patterned by the mask system to a substrate system,
wherein the light source system, the illumination optical system, the mask system, the projection optical system, and the substrate system are accommodated in the second chamber, and
wherein a vacuum pump is connected to the second chamber.

* * * * *